(12) United States Patent
Hwang

(10) Patent No.: US 10,447,252 B2
(45) Date of Patent: Oct. 15, 2019

(54) LEVEL SHIFTER, AND SOURCE DRIVER, GATE DRIVER AND DISPLAY DEVICE INCLUDING THE SAME

(71) Applicant: DB HiTek Co., Ltd., Seoul (KR)

(72) Inventor: Yeon Seong Hwang, Incheon (KR)

(73) Assignee: DB HiTek Co., Ltd., Seoul (KR)

( * ) Notice: Subject to any disclaimer, the term of this patent is extended or adjusted under 35 U.S.C. 154(b) by 78 days.

(21) Appl. No.: 15/884,037

(22) Filed: Jan. 30, 2018

(65) Prior Publication Data
US 2019/0097614 A1  Mar. 28, 2019

(30) Foreign Application Priority Data

Sep. 22, 2017  (KR) .......................... 10-2017-0122191

(51) Int. Cl.
*H03K 3/356* (2006.01)
*G09G 3/20* (2006.01)

(52) U.S. Cl.
CPC ......... *H03K 3/356113* (2013.01); *G09G 3/20* (2013.01); *G09G 3/2092* (2013.01); *H03K 3/35613* (2013.01); *H03K 3/356182* (2013.01); *G09G 2310/0267* (2013.01); *G09G 2310/0286* (2013.01); *G09G 2310/0289* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,243,236 A * | 9/1993 | McDaniel | ........ | H03K 3/356017 326/68 |
| 7,061,299 B2 * | 6/2006 | Khan | ............... | H03K 3/356113 326/68 |
| 7,129,770 B2 * | 10/2006 | Barkley | .................. | G05F 3/205 327/534 |
| 7,777,548 B2 * | 8/2010 | Kang | ................. | H03K 3/35613 326/63 |
| 8,643,425 B2 * | 2/2014 | Chaudhry | ........ | H03K 3/356182 327/306 |
| 8,669,803 B2 * | 3/2014 | Huang | ............. | H03K 3/356165 326/68 |
| 8,786,351 B2 * | 7/2014 | Chen | ............. | H03K 19/017509 326/81 |
| 9,633,734 B1 * | 4/2017 | Po | ...................... | H01L 27/11524 |
| 9,882,566 B1 * | 1/2018 | Po | ............................ | G11C 7/04 |

* cited by examiner

*Primary Examiner* — An T Luu
(74) *Attorney, Agent, or Firm* — Andrew D. Fortney; Central California IP Group, P.C.

(57) ABSTRACT

A level shifter includes (a) an input unit including (i) a first input transistor configured to receive a first voltage and connected to a first connection node, and (ii) a second input transistor configured to receive the first voltage and connected to a second connection node, (b) an output unit including (i) a first output transistor connected to a first output terminal and configured to receive a second voltage, and (ii) a second output transistor connected to a second output terminal and configured to receive the second voltage, (c) a first bias unit configured to control voltage drop between the output terminals and the connection nodes based on a first bias signal, and (d) a second bias unit configured to control a first voltage drop between the first output transistor and the second output terminal and a second voltage drop between the second output transistor and the first output terminal based on a second bias signal.

16 Claims, 8 Drawing Sheets

US 10,447,252 B2

LEVEL SHIFTER, AND SOURCE DRIVER, GATE DRIVER AND DISPLAY DEVICE INCLUDING THE SAME

This application claims the benefit of Korean Patent Application No. 10-2017-0122191, filed on Sep. 22, 2017 which is hereby incorporated by reference as if fully set forth herein.

BACKGROUND OF THE INVENTION

Field of the Invention

Embodiments of the present invention relate to a level shifter, and a source driver, a gate driver and a display device including the same.

Discussion of the Related Art

Electronic units of a display device each require a level shifter, which converts the voltage level of an input signal into a desired one. This level shifter may convert a first voltage level of the input signal into a second voltage level, which is higher than the first voltage level.

In general, the level shifter may include a plurality of transistors and be implemented in the form of an amplifier. Recently, the voltage level of logic that provides an input to the level shifter has gradually decreased. For this reason, the voltage level of a signal input to the level shifter may fail to satisfy the threshold voltage of a transistor constituting an input unit of the level shifter, thereby causing the level shifter not to be normally driven.

SUMMARY OF THE INVENTION

Accordingly, embodiments of the present invention are directed to a level shifter, and a source driver, a gate driver and a display device including the same that substantially obviate one or more problems due to limitations and disadvantages of the related art.

Embodiments of the present invention advantageously provide a level shifter that is capable of reducing the generation or incidence of a peak current and/or the size of the level shifter, and improving the EMI characteristics of the level shifter. Embodiments of the present invention also include a source driver, a gate driver and a display device including the level shifter.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof, as well as the appended drawings.

To achieve these objects and other advantages and in accordance with the purpose(s) of the invention, as embodied and broadly described herein, a level shifter includes (a) an input unit including (i) a first input transistor having a first gate configured to receive a first input signal, a first source, and a first drain connected between a first connection node and a first node configured to receive a first voltage, and (ii) a second input transistor having a second gate configured to receive a second input signal, a second source, and a second drain connected between a second connection node and the first node, (b) an output unit including (i) a first output transistor having a third gate connected to a first output terminal, a third source, and a third drain connected between a second node configured to receive a second voltage and a second output terminal, and (ii) a second output transistor having a fourth gate connected to the second output terminal, a fourth source, and a fourth drain connected between the second node and the first output terminal, (c) a first bias unit connected between the first and second connection nodes and the first and second output terminals, configured to control a first voltage drop between the first and second output terminals and the first and second connection nodes based on a first bias signal, and (d) a second bias unit connected between the first and second output transistors and the first and second output terminals, configured to control a second voltage drop between the first output transistor and the second output terminal and a third voltage drop between the second output transistor and the first output terminal based on a second bias signal.

The level shifter may further include a first switch configured to supply the first voltage to the first connection node based on or in response to a control signal, and a second switch configured to supply the first voltage to the second connection node based on or in response to the control signal.

The level shifter may further include a third switch configured to supply the second voltage to the second output terminal based on or in response to a second control signal.

The level shifter may further include a fourth switch configured to supply the second voltage to the first output terminal based on or in response to the second control signal.

The level shifter may further include a fifth switch configured to supply the first voltage to the first output terminal based on or in response to a third control signal.

The level shifter may further include a sixth switch configured to supply the first voltage to the second output terminal based on or in response to the third control signal.

The second voltage may be higher than the first voltage.

Each of the first and second input transistors may be or comprise an N-channel transistor, and each of the first and second output transistors may be a P-channel transistor. In addition, each of the first and second bias transistors may be or comprise a P-channel transistor.

Furthermore, each of the first and second input transistors may have a smaller channel width than each of the first and second output transistors.

According to other embodiments of the present invention, a level shifter includes (a) an input unit including (i) a first input transistor having a first gate configured to receive a first input signal, a first source, and a first drain connected between a first connection node and a first node configured to receive a first voltage, and (ii) a second input transistor having a second gate configured to receive a second input signal, a second source, and a second drain connected between a second connection node and the first node, (b) an output unit including (i) a first output transistor having a third gate connected to a first output terminal, a third source, and a third drain connected between a second node configured to receive a second voltage and a second output terminal, and (ii) a second output transistor having a fourth gate connected to the second output terminal, a fourth source, and a fourth drain connected between the second node and the first output terminal, (c) a first bias unit including (i) a first bias transistor having a gate configured to receive a first bias signal, a source, and a drain connected between the first connection node and the second output terminal, and (ii) a second bias transistor having a gate configured to receive the first bias signal, a source, and a drain connected between the second connection node and the first output terminal, (d) a second bias unit including (i) a third bias transistor having a gate configured to receive a second bias signal, a source, and a drain connected between the first output transistor and the second output terminal, and (ii) a fourth bias transistor having a gate configured to receive the second bias signal, a source, and a drain connected between the second output transistor and the first output terminal, (e) a first switch configured to supply the first voltage to the first connection node based on or in response to a first control signal, and (f) a second switch configured to supply the first voltage to the second connection node based on or in response to the first control signal.

The first and second output terminals may be respectively set to the first voltage by turning on the first and second bias transistors based on or in response to the first bias signal, turning off the third and fourth bias transistors based on or in response to the second bias signal, and turning on the first and second switches based on or in response to the first control signal.

According to even further embodiments of the present invention, a level shifter includes (a) an input unit including (i) a first input transistor having a first gate configured to receive a first input signal, a first source, and a first drain connected between a first connection node and a first node configured to receive a first voltage, and (ii) a second input transistor having a second gate configured to receive a second input signal, a second source, and a second drain connected between a second connection node and the first node, (b) an output unit including (i) a first output transistor having a third gate connected to a first output terminal, a third source, and a third drain connected between a second node configured to receive a second voltage and a second output terminal, and (ii) a second output transistor having a fourth gate connected to the second output terminal, a fourth source, and a fourth drain connected between the second node and the first output terminal, (c) a first bias unit including (i) a first bias transistor having a gate configured to receive a first bias signal, a source, and a drain connected between the first connection node and the second output terminal, and (ii) a second bias transistor having a gate configured to receive the first bias signal, a source, and a drain connected between the second connection node and the first output terminal, (d) a second bias unit including (i) a third bias transistor having a gate configured to receive a second bias signal, a source, and a drain connected between the first output transistor and the second output terminal, and (ii) a fourth bias transistor having a gate configured to receive the second bias signal, a source, and a drain connected between the second output transistor and the first output terminal, and (e) a first switch connected between the second output terminal and a third node, configured to receive a predetermined first supply voltage and supply the predetermined first supply voltage based on or in response to a first control signal.

The second output terminal may be set to the predetermined first supply voltage by turning off the first to fourth bias transistors based on or in response to the first and second bias signals, and turning on the first switch based on or in response to the first control signal.

The level shifter may further include a second switch connected between the first output terminal and a fourth node, configured to receive a predetermined second supply voltage and supply the predetermined second supply voltage to the first output terminal based on or in response to a second control signal.

The first output terminal may be set to the predetermined second supply voltage by turning off the first to fourth bias transistors based on or in response to the first and second bias signals, and turning on the second switch based on or in response to the second control signal.

The predetermined first supply voltage may be one of the first and second voltages. The predetermined second supply voltage may be one of (e.g., the other of) the first and second voltages.

According to various embodiments of the present invention, a source driver includes a latch unit configured to receive and store data, a level shifter according to any of the various embodiments of the present invention, configured to shift a voltage level of the data from the latch unit, and a digital-to-analog converter unit configured to convert an output (e.g., a digital output) from the level shifter into an analog signal.

According to other embodiments of the present invention, a gate driver includes a shift register configured to generate and output logic signals to drive gate lines, a level shifter according to any of the various embodiments of the present invention, configured to shift voltage levels of the logic signals, and an output buffer unit configured to buffer and output a signal from the level shifter.

According to further embodiments of the present invention, a display device includes (a) a display panel including gate lines in rows, data lines in columns crossing the gate lines such that the gate and data lines form a matrix, and pixels connected to the gate and data lines at respective intersections of the gate and data lines, (b) a gate driver configured to drive the gate lines, and (c) the source driver of any of the various embodiments of the present invention, configured to drive the data lines.

It is to be understood that both the foregoing general description and the following detailed description of various embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
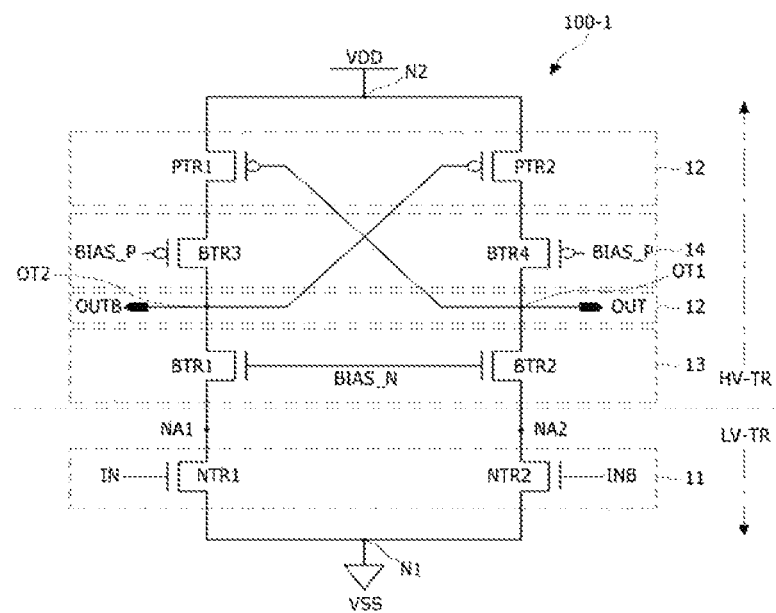
FIG. 1 is a circuit diagram showing the configuration of an exemplary level shifter according to one or more embodiments of the present invention.

Reference will now be made in detail to embodiments of the present invention, examples of which are illustrated in the accompanying drawings.

In the following description of the embodiments, it will be understood that, when an element is referred to as being "on" or "under" another element, it can be directly on or under the other element or can be indirectly on or under the other element with one or more intervening elements therebetween. Furthermore, when the expression "on" or "under" is used herein, it may include the upward direction and the downward direction with reference to an element.

In addition, it will be understood that relative terms used hereinafter, such as "first", "second", "on"/"above"/"over" and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

The terms "including", "comprising", "having" and variations thereof disclosed herein mean "including but not limited to" unless expressly specified otherwise, and, as such, should not be construed to exclude elements other than the elements disclosed herein and should be construed to further include additional elements. In addition, the terms "corresponding" and variations thereof disclosed herein may encompass at least one of meanings of "facing," "overlapping" and "in a unique relationship with."

FIG. 1 shows the configuration of an exemplary level shifter 100-1 according to one or more embodiments of the present invention.

Referring to FIG. 1, the level shifter 100-1 includes an input unit 11, an output unit 12, a first bias unit 13, and a second bias unit 14.

The input unit 11 may include a first input transistor NTR1 configured to receive a first input signal IN, and a second input transistor NTR2 configured to receive a second input signal INB.

In various embodiments, the second input signal INB may be an inverted version of the first input signal IN.

The first input transistor NTR1 may include a first gate configured to receive the first input signal IN, a first source, and a first drain connected or electrically coupled between a first connection node NA1 and a first node N1 configured to receive a first voltage VSS.

For example, the first source of the first input transistor NTR1 may be connected to the first node N1 (e.g., at a ground potential).

The first connection node NA1 may be, but is not limited to, a node configured to connect the first input transistor NTR1 and a first bias transistor BTR1.

For example, the first connection node NA1 may be connected to the first drain of the first input transistor NTR1.

The first voltage VSS may be, but is not limited to, a base voltage, such as a ground voltage.

The second input transistor NTR2 may include a second gate configured to receive the second input signal INB, a second source, and a second drain connected or electrically coupled between a second connection node NA2 and the first node N1.

For example, the second source of the second input transistor NTR2 may be connected to the first node N1.

The second connection node NA2 may be, but is not limited to, a node configured to connect the second input transistor NTR2 and a second bias transistor BTR2.

In addition, the second connection node NA2 may be connected to the second drain of the second input transistor NTR2.

The output unit 12 may receive a second voltage VDD, and output a first output signal OUT through a first output terminal OT1 and a second output signal OUTB through a second output terminal OT2 based on or in response to the first and second input signals IN and INB supplied to the input unit 11.

The second voltage VDD may be higher than the first voltage VSS. For example, the second voltage VDD may be a full-rail supply voltage.

Furthermore, the output unit 12 may include a first output transistor PTR1 and a second output transistor PTR2.

The first output transistor PTR1 may include a third gate connected to the first output terminal OT1, a third source, and a third drain connected between a second node N2 configured to receive the second voltage VDD and the second output terminal OT2.

The second output transistor PTR2 may include a fourth gate connected to the second output terminal OT2, a fourth source, and a fourth drain connected between the second node N2 and the first output terminal OT1.

For example, the third source of the first output transistor PTR1 and the fourth source of the second output transistor PTR2 may be connected or electrically coupled to the second node N2.

Although the second voltage VDD may be higher than the first voltage VSS (e.g., 18V), it is not limited thereto. Generally, the second voltage VDD is not equal to the first voltage VSS.

Also, although the first and second input transistors NTR1 and NTR2 may be implemented using N channel transistors, respectively, and the first and second output transistors PTR1 and PTR2 may comprise or be implemented using P channel transistors, respectively, they are not limited thereto.

The first bias unit 13 may be connected between the first and second connection nodes NA1 and NA2 and the first and second output terminals OT1 and OT2. In addition, the first bias unit 13 may control voltage drops between the first and second output terminals OT1 and OT2 and the first and second connection nodes NA1 and NA2 based on or in response to a first bias signal BIAS_N.

For example, the first bias unit 13 may be electrically coupled between the first and second drains of the first and second input transistors NTR1 and NTR2 of the input unit 11 and the first and second output terminals OT1 and OT2 of the output unit 12.

The first bias unit 13 may provide voltages at the first and second connection nodes NA1 and NA2 lower than the voltages at the first and second output terminals OT1 and OT2.

The first bias unit 13 may include the first bias transistor BTR1 and the second bias transistor BTR2.

The first bias transistor BTR1 may include a gate configured to receive the first bias signal BIAS_N, a source, and a drain connected between the first connection node NA1 and the second output terminal OT2.

The second bias transistor BTR2 may include a gate configured to receive the first bias signal BIAS_N, a source, and a drain connected between the second connection node NA2 and the first output terminal OT1.

The first and second input signals IN and INB of the input unit 11 may have a lower level than the output signals OUT and OUTB output from the first and second output terminals OT1 and OT2. For example, the first and second input signals IN and INB may have a voltage level of 1.8V, and the output signals OUT and OUTB may have a voltage level of about 15 to 18V. The first and second input signals IN and INB and the output signals OUT and OUTB may represent a differential signal.

When the first bias unit 13 is omitted, the voltage difference between the first and second connection nodes NA1 and NA2 of the input unit 11 and the first node N1 may increase up to a voltage close to the second voltage VDD. In this case, the first and second input transistors NTR1 and NTR2 may be damaged.

The first bias unit 13 may prevent the first and second input transistors NTR1 and NTR2 from being damaged by a high-level output voltage on one or both of the output signals OUT and OUTB.

The second bias unit 14 is connected between the first and second output transistors PTR1 and PTR2 of the output unit 12 and the first and second output terminals OT1 and OT2.

The second bias unit 14 may control a voltage drop (e.g., a second voltage drop) between the first output transistor PTR1 and the second output terminal OT2 and a voltage drop (e.g., a third voltage drop) between the second output transistor PTR2 and the first output terminal OT1 based on a second bias signal BIAS-P.

For example, the second bias unit 14 may include a third bias transistor BTR3 and a fourth bias transistor BTR4.

The third bias transistor BTR3 may include a gate configured to receive the second bias signal BIAS_P, a source, and a drain connected between the first output transistor PTR1 and the second output terminal OT2.

The fourth bias transistor BTR4 may include a gate configured to receive the second bias signal BIAS_P, a source, and a drain connected between the second output transistor PTR2 and the first output terminal OT1.

When a signal transitions such that the voltage OUT or OUTB of the output terminal OT1 or OT2 transitions from a high level (e.g., 18V) to a low level (e.g., 10V) or from the low level to the high level, there may be a period in which the first input transistor NTR1 and the first output transistor PTR1 simultaneously turn on, or the second input transistor NTR2 and the second output transistor PTR2 simultaneously turn on. In this case, a short-circuit current may momentarily flow between the first node N1 and the second node N2. Such a short-circuit current may cause or be exhibited in the form of periodic peak current in every transition of the level shifter, and thus, may degrade the electromagnetic interference (EMI) characteristics of an associated source driver.

As described above, the second bias unit 14 may control the second voltage drop between the first output transistor PTR1 and the second output terminal OT2 and the third voltage drop between the second output transistor PTR2 and the first output terminal OT1 based on the second bias signal BIAS-P.

In addition, the second bias unit 14 may control the intensity of current flowing between the first output transistor PTR1 and the second output terminal OT2 and the intensity of current flowing between the second output transistor PTR2 and the first output terminal OT1 based on a second bias signal BIAS-P.

In accordance with voltage drop control or current intensity control of the second bias unit 14, it may be possible to prevent the first input transistor NTR1 and first output transistor PTR1 from simultaneously turning on and to prevent the second input transistor NTR2 and second output transistor PTR2 from simultaneously turning on. As a result, the generation and/or incidence of peak current in the level shifter may be reduced or eliminated.

For example, each of the first and second input transistors NTR1 and NTR2 may comprise or be implemented using a low-voltage transistor, and each of the first and second output transistors PTR1 and PTR2 may comprise or be implemented using a high-voltage transistor.

In addition, each of the first and second bias transistors BTR1 and BTR2 may comprise or be implemented using a high-voltage transistor. Each of the third and fourth bias transistors BTR3 and BTR4 may also comprise or be implemented using a high-voltage transistor.

Here, the voltage applied to the gate of a low-voltage transistor may be lower than the voltage applied to the gate of a high-voltage transistor. Alternatively, the low-voltage transistor may have a smaller channel width than the high-voltage transistor.

For example, each of the first and second input transistors NTR1 and NTR2 may have a smaller channel width than the first and second output transistors PTR1 and PTR2.

The term "channel" may mean a passage through which carriers (or electrons) flow between the source and drain of a transistor due to a gate voltage applied to the gate of the transistor.

The high-voltage transistor may be a transistor configured to receive a voltage having a level higher than a predetermined voltage level of the first and second connection nodes NA1 and NA2. On the other hand, the low-voltage transistor may be a transistor configured to receive a voltage having a level lower than or equal to the predetermined voltage level of the first and second connection nodes NA1 and NA2.

The first and second input transistors NTR1 and NTR2 may operate as low-voltage transistors by virtue of the first and second bias transistors BTR1 and BTR2 of the first bias unit 13 and, as such, the first and second input transistors NTR1 and NTR2 may be designed to have a reduced channel width. Accordingly, the level shifter may have a reduced size.

The first bias unit 13 may also be referred to as "a first voltage drop unit", "a first current limit unit", or "a first load unit". The second bias unit 14 may also be referred to as "a second voltage drop unit", "a second current limit unit", or "a second load unit".

Figure 2A:
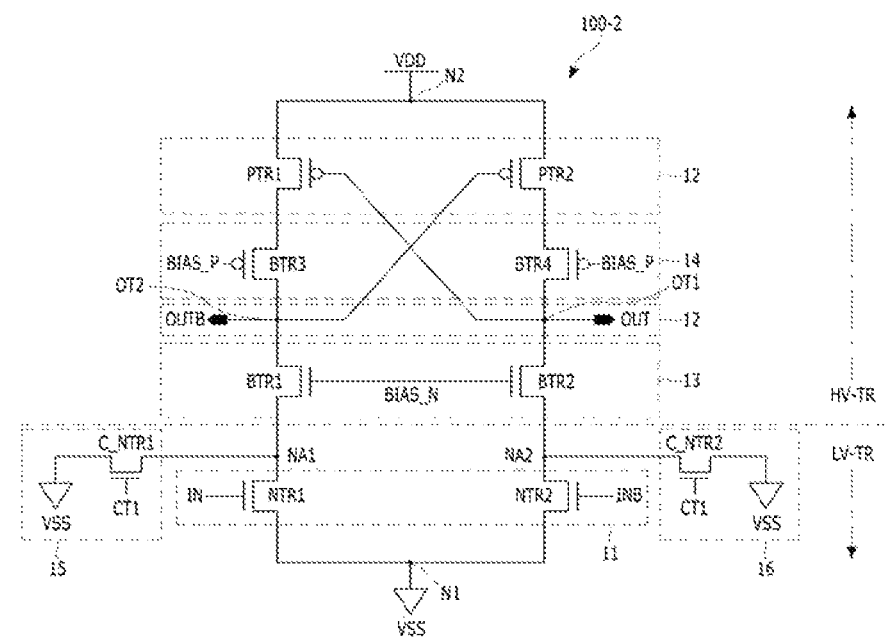
FIG. 2A is a circuit diagram showing the configuration of an exemplary level shifter according to one or more other embodiments of the present invention.
Figure 2B:
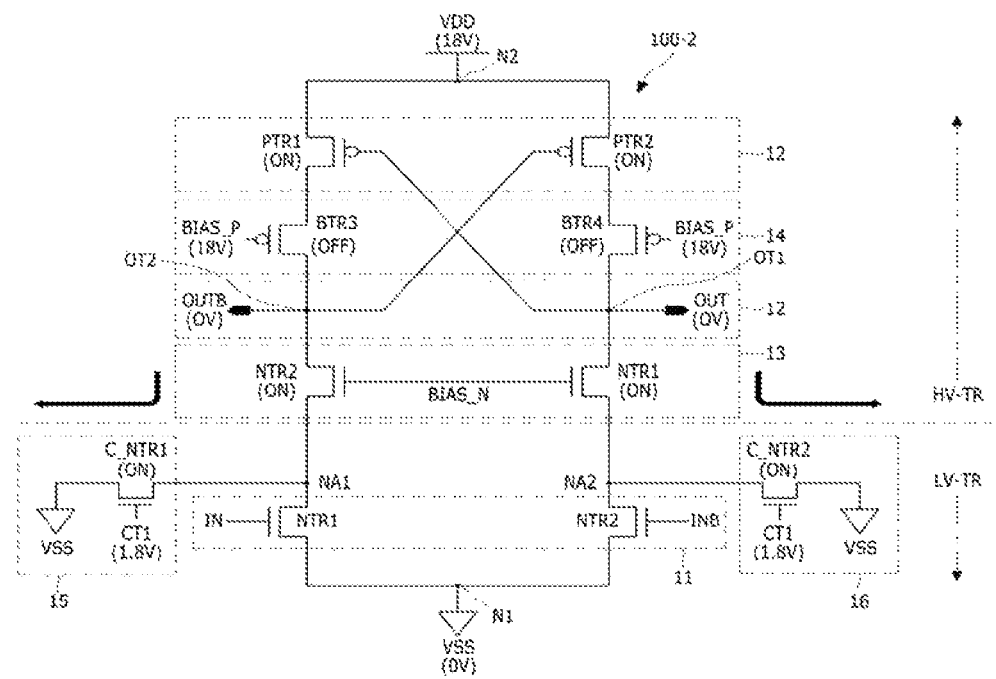
FIG. 2B is a circuit diagram illustrating the operation of the exemplary level shifter of FIG. 2A.

FIG. 2A shows the configuration of an exemplary level shifter 100-2 according to one or more other embodiments of the present invention. FIG. 2B illustrates operation of the exemplary level shifter of FIG. 2A. In FIGS. 2A and 2B, reference numerals identical to those of FIG. 1 designate the same constituent elements and, as such, description of the constituent elements will be omitted or briefly given.

Referring to FIGS. 2A and 2B, the level shifter 100-2 may include the input unit 11, the output unit 12, the first bias unit 13, the second bias unit 14, a first switch 15, and a second switch 16. That is, the level shifter 100-2 may further include the first switch 15 and the second switch 16 in addition to the configuration of the level shifter 100-1 of FIG. 1.

The first switch 15 may turn on or off based on (e.g., in response to) a first control signal CT1, and may supply a first voltage VSS to the first connection node NA1.

The second switch 16 may turn on or off based on a first control signal CT1, and may supply the first voltage VSS to the second connection node NA2.

For example, the first switch 15 may be or comprise a transistor C_NTR1 having a gate configured to receive the first control signal CT1, a source, and a drain connected between the first connection node NA1 and the first voltage VSS (or the first node N1).

In addition, the first switch 15 may comprise or be implemented using an N-channel transistor. The first switch 15 is not limited to the above-described configuration, and may comprise or be implemented using a P-channel transistor.

Furthermore, the second switch 16 may be or comprise a transistor C_NTR2 having a gate configured to receive the first control signal CT1, a source, and a drain connected between the second connection node NA2 and the first voltage VSS (or the first node N1).

Also, the second switch 16 may comprise or be implemented using an N-channel transistor. The second switch 16 is not limited to the above-described configuration, and may comprise or be implemented using a P-channel transistor.

The first and second switches 15 and 16 may be or comprise switches configured to perform a cut-off operation for the level shifter 100-2. Here, "cut-off operation" may be an operation for setting an initial output state or initial output value of the level shifter, or an operation required for an IC test (e.g., a high-voltage stress test).

Referring to FIG. 2B, in a cut-off operation, each of the third and fourth bias transistors BTR3 and BTR4 in the second bias unit 14 may turn off in response to the second bias signal BIAS_P (e.g., a high logic level signal).

In addition, each of the first and second bias transistors BTR1 and BTR2 in the first bias unit 13 may turn on in response to the first bias signal BIAS_N (e.g., by a high logic level signal).

Each of the first and second switches 15 and 16 may also turn on in response to the first control signal CT1 (e.g., by a high logic level signal).

For example, it may be possible to converge or fix voltages OUT and OUTB of the first and second output terminals OT1 and OT2 to the first voltage VSS by turning on the first and second bias transistors BTR1 and BTR2 based on or in response to the first bias signal BIAS_N, turning off the third and fourth bias transistors BTR3 and BTR4 based on or in response to the second bias signal BAS_P, and turning on the first and second switches 15 and 16, namely, the transistors C_NTR1 and C-NTR2, based on or in response to the first control signal CT1. That is, the initial states or initial values of the output voltages OUT and OUTB of the first and second output terminals OT1 and OT2 may be set to the first voltage VSS.

Figure 3:
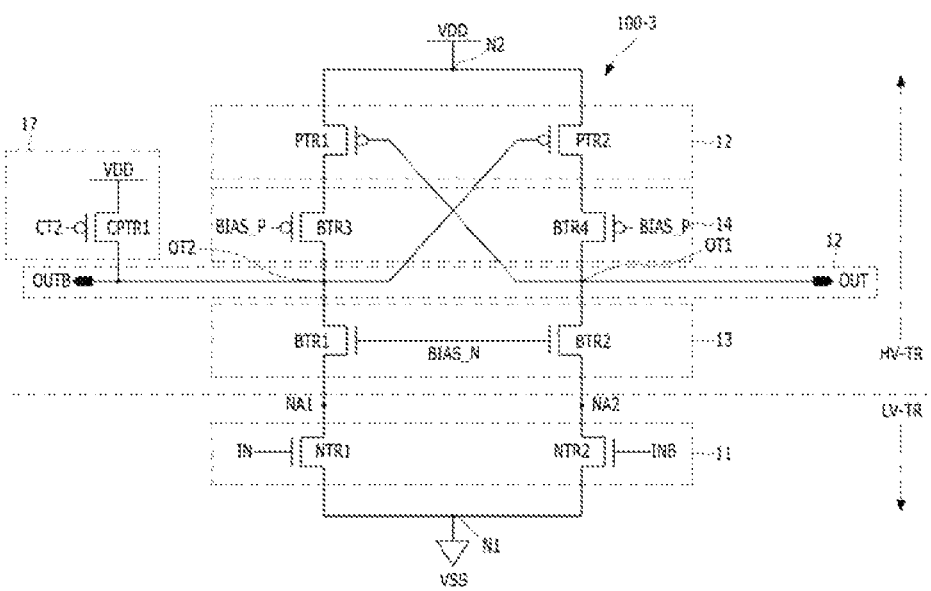
FIG. 3 is a circuit diagram showing the configuration of an exemplary level shifter according to one or more other embodiments of the present invention.

FIG. 3 shows the configuration of an exemplary level shifter 100-3 according to various embodiments of the present invention.

Referring to FIG. 3, the level shifter 100-3 may include the input unit 11, the output unit 12, the first bias unit 13, the second bias unit 14, and a third switch 17.

That is, the level shifter 100-3 may further include the third switch 17 in addition to the configuration of the level shifter 100-1 of FIG. 1.

The third switch 17 may be turned on or off based on or in response to a second control signal CT2, and may supply a second voltage VDD to the second output terminal OT2.

In addition, the third switch 17 may be or comprise a transistor C_PTR1 having a gate configured to receive the second control signal CT2, a source, and a drain connected between the second output terminal OT2 and the second voltage VDD (or the second node N2).

Furthermore, the third switch 17 may comprise or be implemented using a P-channel transistor. The third switch 17 is not limited to the above-described configuration, and may comprise or be implemented using an N-channel transistor.

In a cut-off operation in the embodiment(s) of FIG. 3, each of the first and second bias transistors BTR1 and BTR2 in the first bias unit 13 may turn off in response to the first bias signal BIAS_N (e.g., in response to a low logic level signal).

In addition, each of the third and fourth bias transistors BTR3 and BTR4 in the second bias unit 14 may turn off in response to the second bias signal BIAS_P (e.g., in response to a high logic level signal).

The third switch 17 may also turn on in response to the second control signal CT2 (e.g., in response to a low logic level signal) and, as such, the second voltage VDD may be supplied to the second output terminal OT2. Accordingly, the voltage of the second output terminal OT2 may be set to the second voltage VDD.

For example, fixing the voltage OUTB of the second output terminal OT2 to the second voltage VDD may be performed by turning on the first to fourth bias transistors BTR1 to BTR4 based on or in response to the first and second bias signals BIAS_N and BAS_P, and turning on the third switch 17 based on or in response to the second control signal CT2.

Figure 4A:
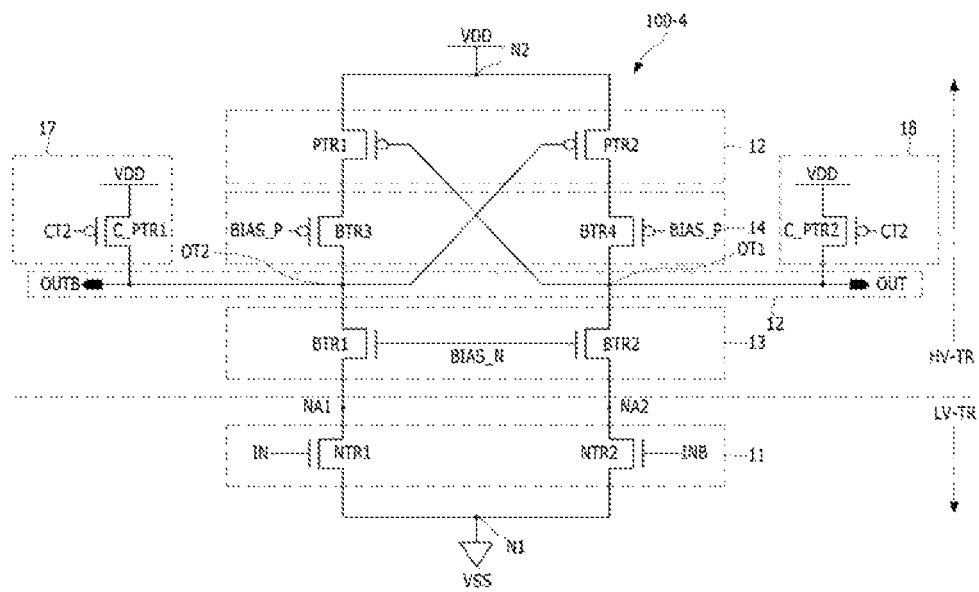
FIG. 4A is a circuit diagram showing the configuration of an exemplary level shifter according to one or more other embodiments of the present invention.
Figure 4B:
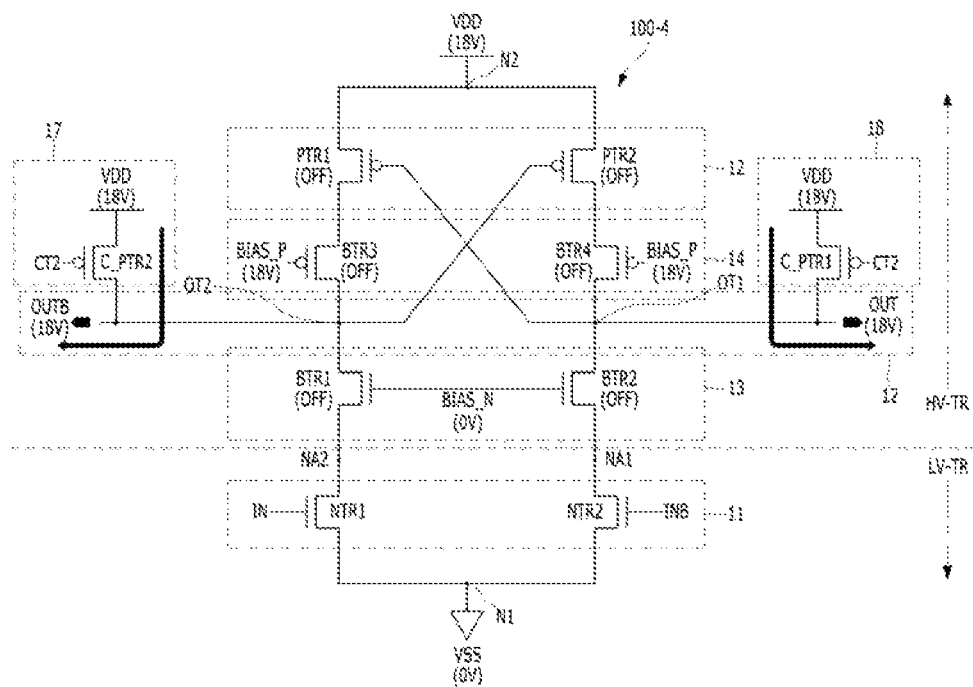
FIG. 4B is a circuit diagram illustrating the operation of the exemplary level shifter of FIG. 4A.

FIG. 4A shows the configuration of an exemplary level shifter 100-4 according to one or more other embodiments of the present invention. FIG. 4B illustrates operation of the level shifter of FIG. 4A. In FIGS. 4A and 4B, reference numerals identical to those of FIG. 1 designate the same constituent elements and thus, description of the constituent elements will be omitted or briefly given.

Referring to FIGS. 4A and 4B, the level shifter 100-4 may further include a fourth switch 18 in addition to the configuration of the level shifter 100-3 of FIG. 3. The description of the third switch in FIG. 3 may also be applied to FIGS. 4A and 4B.

The fourth switch 18 may turn on or off based on (e.g., in response to) the second control signal CT2 and thus, may supply the second voltage VDD to the first output terminal OT1.

In addition, the fourth switch 18 may be or comprise a transistor C_PTR2 including a gate configured to receive the second control signal CT2, a source, and a drain connected between the first output terminal OT1 and the second voltage VDD (or the second node N2).

Furthermore, the fourth switch 18 may comprise or be implemented using a P-channel transistor. The fourth switch 18 is not limited to the above-described configuration, and may comprise or be implemented using an N-channel transistor.

Referring to FIG. 4B, in a cut-off operation, each of the first to fourth bias transistors BTR1 to BTR4 may turn off in response to the first and second bias signals BIAS_N and BIAS_P.

In addition, the third and fourth switches 17 and 18 may turn on in response to the second control signal CT2 and, as such, the second voltage VDD may be supplied to the first and second output terminals OT1 and OT2. Accordingly, each voltage of the first and second output terminal OT1 and OT2 may be set to the second voltage VDD.

For example, converging or fixing the voltage OUT of the first output terminal OT1 and the voltage OUTB of the second output terminal OT2 to the second voltage VDD may be performed by turning off the first to fourth bias transistors BTR1 to BTR4, and turning on the third and fourth switches 17 and 18.

Although not shown, in various embodiments of the present invention, the level shifter thereof may further include the first and second switches 15 and 16 of FIG. 2A and the third switch 17 of FIG. 3 in addition to the configuration of the embodiment of FIG. 1. In various embodiments of the present invention, the level shifter thereof may further include the first and second switches 15 and 16 of FIG. 2A and the third and fourth switches 17 and 18 of FIG. 4A in addition to the configuration of the embodiment of FIG. 1.

In further embodiments of the present invention, the third switch 17 may be omitted from the level shifter 100-4 of FIG. 4A.

Figure 5:
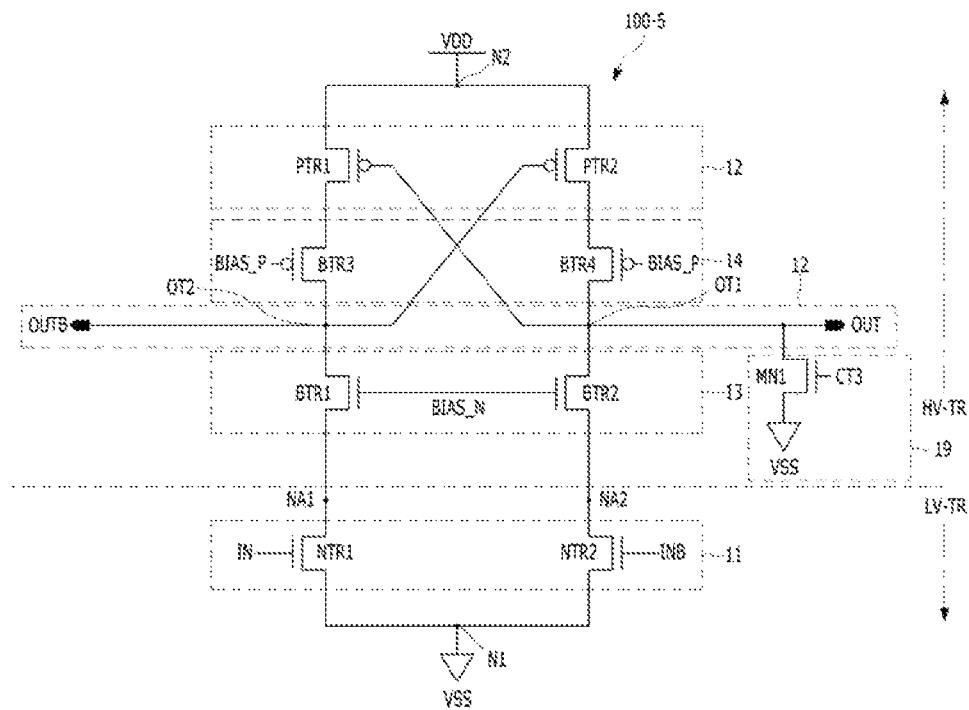
FIG. 5 is a circuit diagram showing the configuration of an exemplary level shifter according to one or more other embodiments of the present invention.

FIG. 5 shows the configuration of an exemplary level shifter 100-5 according to one or more other embodiments of the present invention. In FIG. 5, reference numerals identical to those of FIG. 1 designate the same constituent elements and, as such, description of the constituent elements will be omitted or briefly given.

Referring to FIG. 5, the level shifter 100-5 may further include a fifth switch 19 in addition to the configuration of the level shifter 100-1 of FIG. 1.

For example, the fifth switch 19 may be or comprise a transistor MN1 having a gate configured to receive a third control signal CT3, a source, and a drain connected between the first output terminal OT1 and the first voltage VSS (or the first node N1).

For example, the fifth switch 19 may comprise or be implemented using an N-channel transistor. The fifth switch 19 is not limited to the above-described configuration, and may comprise or be implemented using a P-channel transistor.

In a cut-off operation in the embodiment(s) of FIG. 5, each of the first to fourth bias transistors BTR1 to BTR4 may turn off in response to the first and second bias signals BIAS_N and BIAS_P. In addition, the fifth switch 19 may turn on in response to the third control signal CT3. Accordingly, the first voltage VSS is supplied to the first output terminal OT1 and, as such, the voltage of the first output terminal OT1 may be set to the first voltage VSS.

Although not shown, in various embodiments of the present invention, the level shifter thereof may further include the first and second switches 15 and 16 of FIG. 2A in addition to the configuration of the embodiment of FIG. 5.

Figure 6:
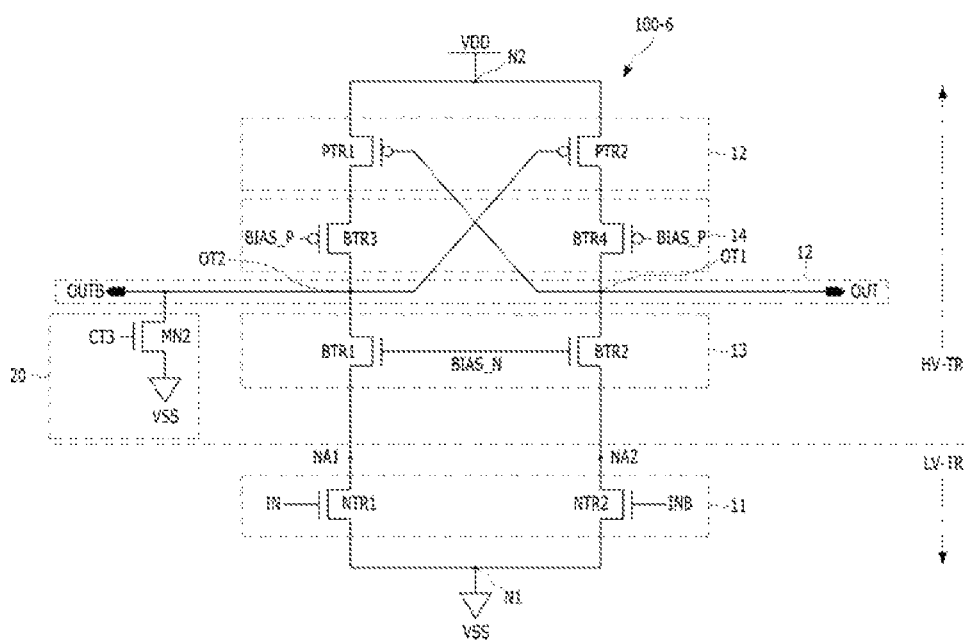
FIG. 6 is a circuit diagram showing the configuration of an exemplary level shifter according to one or more other embodiments of the present invention.

FIG. 6 shows the configuration of an exemplary level shifter 100-6 according to one or more other embodiments of the present invention. In FIG. 6, reference numerals identical to those of FIG. 5 designate the same constituent elements and, as such, description of the constituent elements will be omitted or briefly given.

Referring to FIG. 6, the level shifter 100-5 may further include a sixth switch 20 in addition to the configuration of the level shifter 100-1 of FIG. 1.

For example, the sixth switch 20 may be or comprise a transistor MN2 having a gate configured to receive the third control signal CT3, a source, and a drain connected between the second output terminal OT2 and the first voltage VSS (or the first node N1).

For example, the sixth switch 20 may comprise or be implemented using an N-channel transistor. The sixth switch 20 is not limited to the above-described configuration, and may comprise or be implemented using a P-channel transistor.

In a cut-off operation in the embodiment(s) of FIG. 6, each of the first to fourth bias transistors BTR1 to BTR4 may turn off in response to the first and second bias signals BIAS_N and BIAS_P. In addition, the sixth switch 20 may turn on in response to the third control signal CT3. Accordingly, the first voltage VSS is supplied to the second output terminal OT2 and, as such, the voltage of the second output terminal OT2 may be set to the first voltage VSS.

Although not shown, in various embodiments of the present invention, the level shifter thereof may further include the first and second switches 15 and 16 of FIG. 2A in addition to the configuration of the embodiment of FIG. 6.

Figure 7:
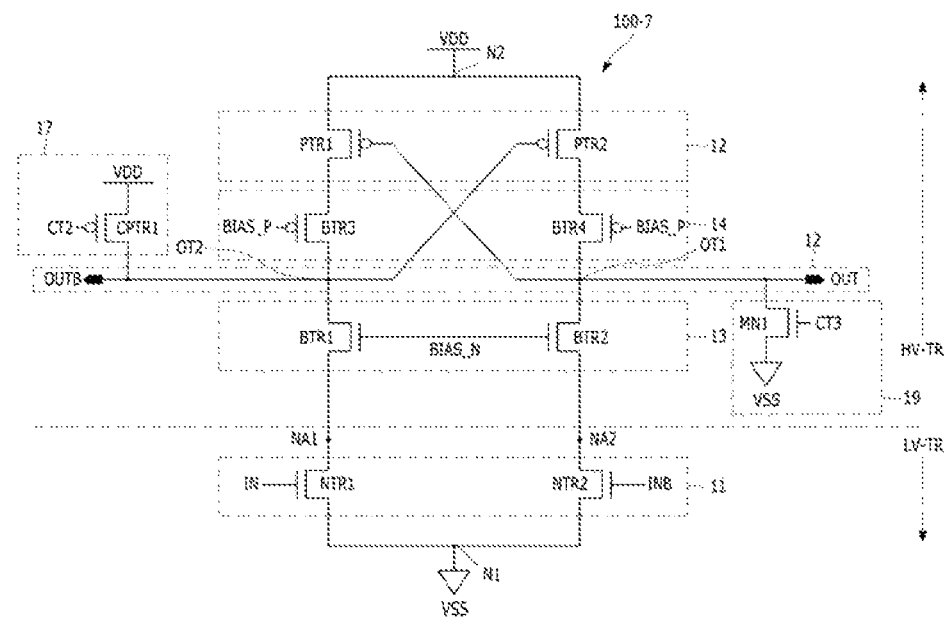
FIG. 7 is a circuit diagram showing the configuration of an exemplary level shifter according to one or more other embodiments of the present invention.

FIG. 7 shows the configuration of an exemplary level shifter 100-7 according to one or more other embodiments of the present invention.

Referring to FIG. 7, the level shifter 100-7 of FIG. 7 may be or comprise a modified embodiment of FIG. 3.

The level shifter 100-5 may further include a fifth switch 19 in addition to the configuration of the level shifter 100-3 of FIG. 3.

In a cut-off operation in the embodiment(s) of FIG. 7, the first to fourth bias transistors BTR1 to BTR4 may turn off, and the third and fifth switches 17 and 19 may turn on. Accordingly, the voltage OUT of the first output terminal OT1 may be set to the first voltage VSS, and the voltage OUTB of the second output terminal OT2 may be set to the second voltage VDD.

In yet further embodiments of the present invention, the third switch 17 may be omitted from the configuration of FIG. 4A, and the sixth switch 20 may be substituted for the third switch 17. In this case, in a cut-off operation, the first to fourth bias transistors BTR1 to BTR4 may turn off, and the fourth and sixth switches 18 and 20 may turn on. Accordingly, the voltage OUT of the first output terminal OT1 may be set to the second voltage VDD, and the voltage OUTB of the second output terminal OT2 may be set to the first voltage VSS.

Although not shown, in one or more other embodiments of the present invention, the level shifter thereof may further include the first and second switches 15 and 16 of FIG. 2A in addition to the configuration of the embodiment of FIG. 7.

The third to sixth switches 17 to 20 in the level shifters according to the embodiments illustrated in FIGS. 3 to 7 may be expressed as the following first and second switches in that they use a predetermined first supply voltage and a second supply voltage for execution of a cut-off operation.

In this case, each level shifter may include the input unit 11, the output unit 12, the first bias unit 13, the second bias unit 14, a first switch, and a second switch.

The first switch may be connected between the second output terminal OT2 and a third node configured to receive a predetermined first supply voltage. The first switch may supply the predetermined first supply voltage to the second output terminal OT2 based on or in response to a first control signal. For example, the predetermined first supply voltage may be the first voltage VSS or the second voltage VDD.

The second switch may be connected between the first output terminal OT1 and a fourth node configured to receive a predetermined second supply voltage. The second switch may supply the predetermined second supply voltage to the first output terminal OT1 based on or in response to a second control signal. For example, the second supply voltage may be the first voltage VSS or the second voltage VDD.

In a cut-off operation, setting the voltage OUTB of the second output terminal OT2 to the predetermined first supply voltage may be performed by turning off each of the first to fourth bias transistors BTR1 to BTR4 using the first and second bias signal BIAS_N and BIAS_P, and turning on the first switch using the first control signal.

In the cut-off operation, setting the voltage OUT of the first output terminal OT1 to the predetermined second supply voltage may be performed by turning off each of the first to fourth bias transistors BTR1 to BTR4 using the first and second bias signal BIAS_N and BIAS_P, and turning on the second switch using the second control signal.

Figure 8:
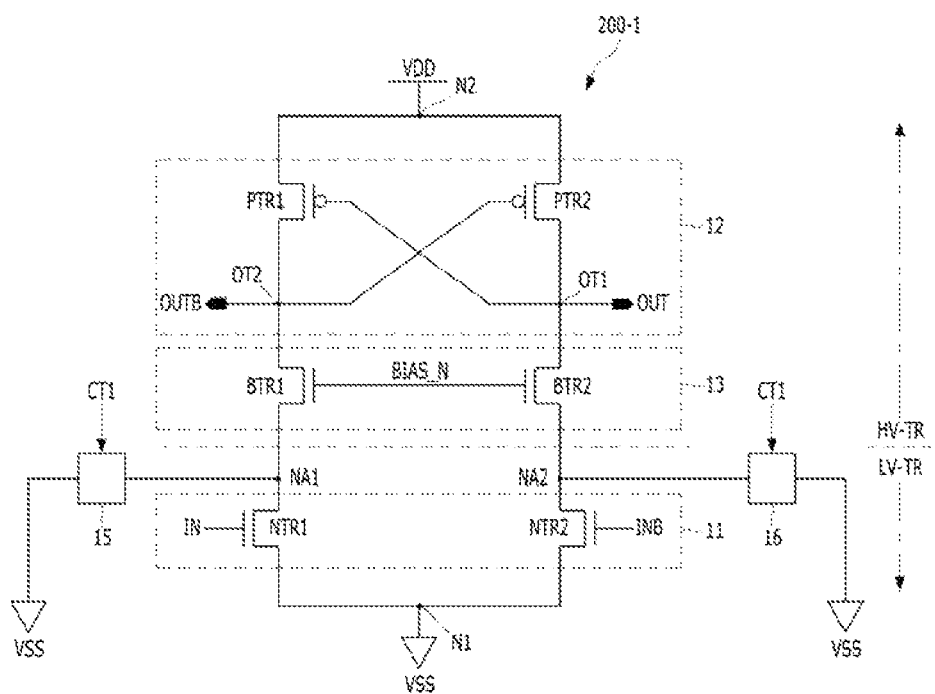
FIG. 8 is a circuit diagram showing the configuration of an exemplary level shifter according to one or more other embodiments of the present invention.

FIG. 8 shows the configuration of an exemplary level shifter 200-1 according to one or more other embodiments of the present invention.

Referring to FIG. 8, the level shifter 200-1 may be configured by omitting the second bias unit 14 from the configuration of the level shifter 100-1 of FIG. 1, and adding the first and second switches 15 and 16 of FIG. 2A to the configuration. In FIG. 8, reference numerals identical to those of FIGS. 1 and 2A designate the same constituent elements and, as such, description of the constituent elements will be omitted or briefly given. The description given with reference to FIG. 2B may also be referred to in conjunction with operations of the first and second switches 15 and 16.

Figure 9:
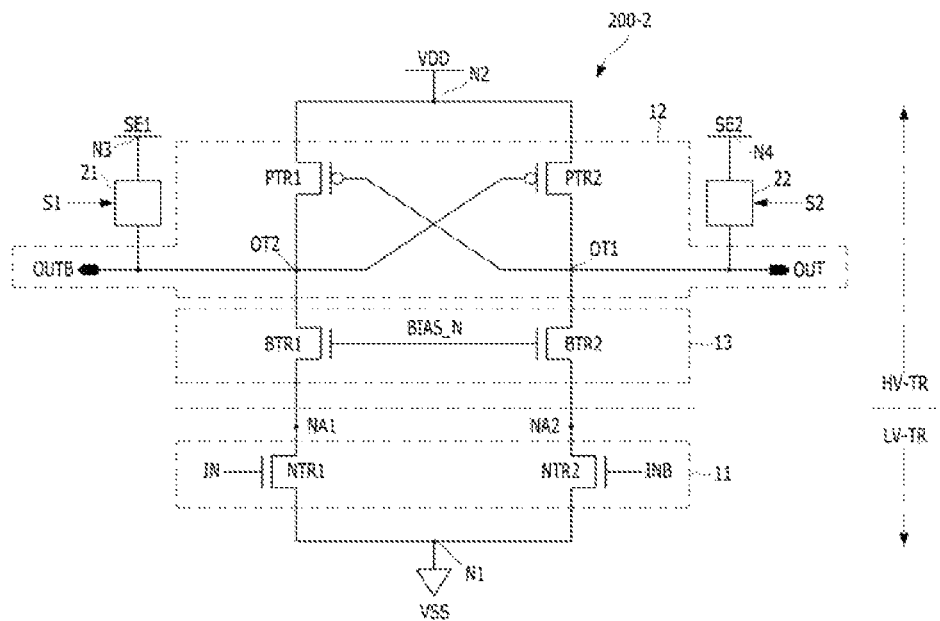
FIG. 9 is a circuit diagram showing the configuration of an exemplary level shifter according to one or more other embodiments of the present invention.

FIG. 9 shows the configuration of an exemplary level shifter 200-2 according to various embodiments of the present invention.

Referring to FIG. 9, the level shifter 200-2 may be configured by omitting the second bias unit 14 from the configuration of the level shifter 100-1 of FIG. 1, and adding switches 21 and 22 to the configuration.

Referring to FIGS. 8 and 9, in the output unit 12, the third drain of the first output transistor PTR1 may be connected to the second output terminal OT2, and the fourth drain of the second output transistor PTR2 may be connected to the first output terminal OP1.

The first switch 21 may supply a predetermined first supply voltage SE1 to the second output terminal OT2 based on a first control signal S1.

For example, the first switch 21 may be connected between the second output terminal OT2 and a third node N3 and, as such, may supply the predetermined first supply voltage SE1 to the second output terminal OT2 based on or in response to the first control signal S1.

In addition, the first switch 21 may include a gate configured to receive the first control signal S1, a source, and a drain connected between the second output terminal OT2 and the first supply voltage SE1 (or the third node N3). For example, the third node N3 may be a node configured to receive the first supply voltage SE1.

The second switch 22 may supply a predetermined second supply voltage SE2 to the first output terminal OT1 based on or in response to a second control signal S2.

In addition, the second switch 22 may be connected between the first output terminal OT1 and a fourth node N4 and may supply the predetermined second supply voltage SE2 to the first output terminal OT1 based on the second control signal S2.

The second switch 22 may include a gate configured to receive the second control signal S2, a source, and a drain connected between the first output terminal OT1 and the second supply voltage SE2 (or the fourth node N4). For example, the fourth node N4 may be a node configured to receive the second supply voltage SE2.

The first supply voltage SE1 may be any one of the first and second voltages VSS and VDD, and the second supply voltage SE2 may be any one of the first and second voltages VSS and VDD.

In addition, the first switch 21 and the second switch 22 may be independently controlled.

For example, through independent control of the first and second switches 21 and 22, the first voltage VSS or the second voltage VDD may be supplied to each of the first and second output terminals OT1 and OT2.

Setting the voltage of the second output terminal OT2 to the predetermined first supply voltage SE1 and/or setting the voltage of the first output terminal OT1 to the predetermined second supply voltage SE2 may be performed by turning off the first and second bias transistors BTR1 and BTR2 based on or in response to the first bias signal BIAS_N, and turning on at least one of the first and second switches 21 and 22 based on or in response to the first and second control signals S1 and S2.

Alternatively, in accordance with operations of the first and second switches 21 and 22, the first voltage VSS may be supplied to the first output terminal OT1, and the second voltage VDD may be supplied to the second output terminal OT2.

Alternatively, for in accordance with operations of the first and second switches 21 and 22, the second voltage VDD may be supplied to the first output terminal OT1, and the first voltage VSS may be supplied to the second output terminal OT2.

Although not shown, in one or more other embodiments of the present invention, the level shifter thereof may further include the first and second switches 15 and 16 in addition to the configuration of the embodiment of FIG. 9.

Figure 10:
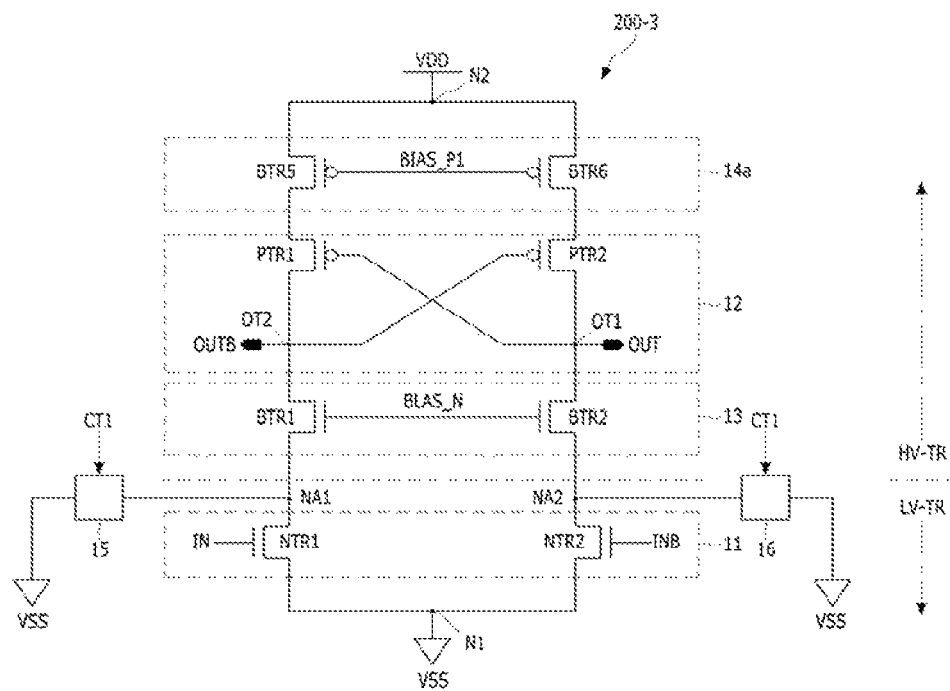
FIG. 10 is a circuit diagram showing the configuration of an exemplary level shifter according to one or more other embodiments of the present invention.

FIG. 10 shows the configuration of an exemplary level shifter 200-3 according to one or more other embodiments of the present invention.

Referring to FIG. 10, the level shifter 200-3 may be configured by adding a bias unit 14a to the configuration of the level shifter 200-1 of FIG. 8.

The description of the cut-off operation in the level shifter 200-1 of FIG. 8 may also be referred to in conjunction with the level shifter 200-3 of FIG. 10.

The bias unit 14a may be connected to the second node N2 and the first and second output transistors PTR1 and PTR2 of the output unit 120 and, as such, may control the first voltage drop between the second node N2 and the first and second output transistors PTR1 and PTR2 based on a bias signal BIAS-P1.

In addition, the bias unit 14a may include a fifth bias transistor BTR5 and a sixth bias transistor BTR6.

The fifth bias transistor BTR5 may include a gate configured to receive the bias signal BIAS-P, a source, and a drain connected between the first output transistor PTR1 (e.g., the third source) and the second node N2.

The sixth bias transistor BTR6 may include a gate configured to receive the bias signal BIAS-P, a source, and a drain connected between the second output transistor PTR2 (for example, the fourth source) and the second node N2.

By virtue of the voltage drop caused by the bias unit 14a, the output voltages OUT and OUTB of the first and second output terminals OT1 and OT2 may be reduced below the second voltage VDD.

By virtue of the voltage drop caused by the bias unit 14a, it may also be possible to reduce the intensity of current flowing through the first and second output transistors PTR1 and PTR2 of the output terminal 12.

Figure 11:
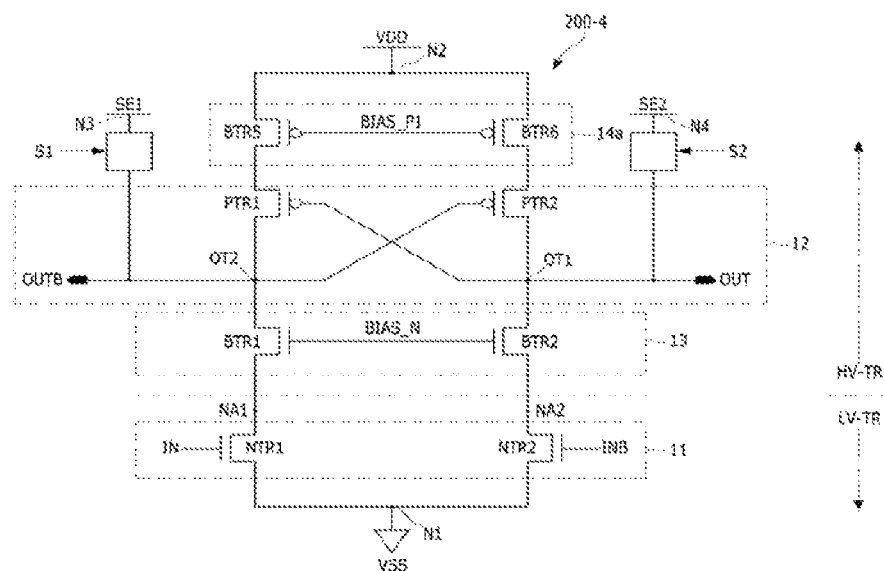
FIG. 11 is a circuit diagram showing the configuration of an exemplary level shifter according to one or more other embodiments of the present invention.

FIG. 11 shows the configuration of an exemplary level shifter 200-4 according to one or more other embodiments of the present invention.

Referring to FIG. 11, the level shifter 200-4 may be configured by adding the bias unit 14a to the configuration of the level shifter 200-2 of FIG. 9. The description of the cut-off operation in the level shifter 200-1 of FIG. 9 may also be applied to FIG. 11. In addition, the description of the bias unit 14a of FIG. 10 may be applied to FIG. 11.

Generally, level shifters have a configuration only including high-voltage transistors, such that a low-voltage input signal may be applied to the gate(s) of the high-voltage transistors. In a level shifter having such a configuration, operations of the level shifter may be limited in accordance with the low-voltage input signal and any variation in the threshold voltage of the high-voltage transistors.

In each of the various embodiments, however, a level shifter having an input terminal in or constituted by a low-voltage transistor may be used and, as such, the level shifter may operate irrespective of the voltage level of a low-voltage input signal. Thus, embodiments of the invention may be applied to a source driver having a low-logic supply voltage and various appliances including such a source driver.

In addition, each of the various embodiments may reduce the generation or incidence of peak current in the level shifter thereof and may improve EMI characteristics of an associated source driver through the use of the second bias unit 14.

Although not shown, in various embodiments of the present invention, the level shifter thereof may further include the first and second switches 15 and 16 in addition to the configuration of the embodiments of FIG. 11.

Figure 12:
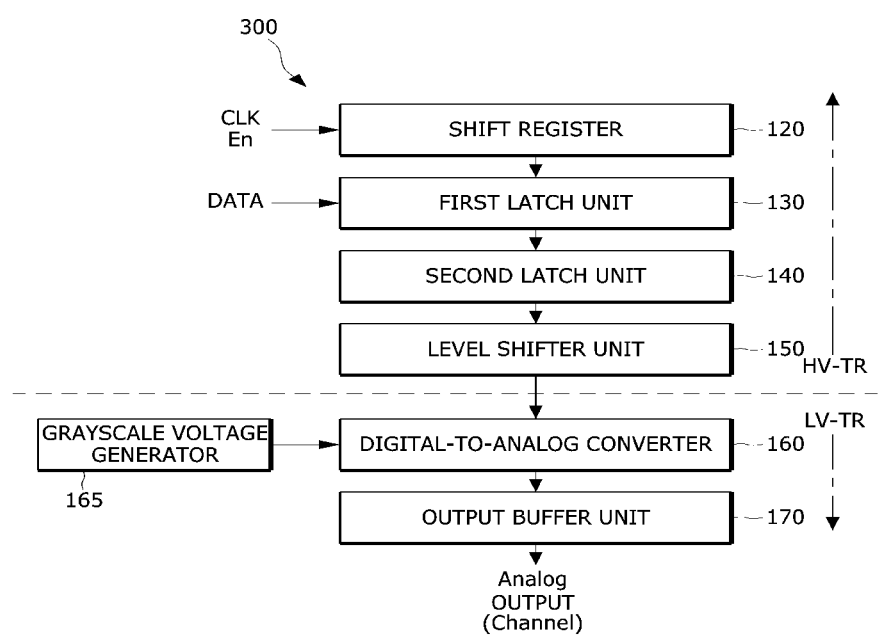
FIG. 12 is a block diagram showing the configuration of an exemplary source driver according to one or more embodiments of the present invention.

FIG. 12 shows the configuration of an exemplary source driver 300 according to one or more embodiments of the present invention.

Referring to FIG. 12, the source driver 300 includes a shift register 120, a first latch unit 130, a second latch unit 140, a level shifter unit 150, a digital-to-analog converter 160, a grayscale voltage generator 165, and an output buffer unit 170.

The shift register 120 generates shift signals to control the timing of storage of data DATA (for example, digital image data) in the first latch unit 130.

For example, the shift register 120 may receive a horizontal start signal from a timing controller (not shown), and may shift the received horizontal start signal in response to a clock signal CLK to generate the shift signals. The horizontal start signal may be used together with a start pulse.

The first latch unit 130 stores data DATA received from the timing controller (not shown) in response to the shift signals generated from the shift register 210.

The first latch unit 130 may include a plurality of first latches (not shown). The first latches may store data DATA.

Figure 14:
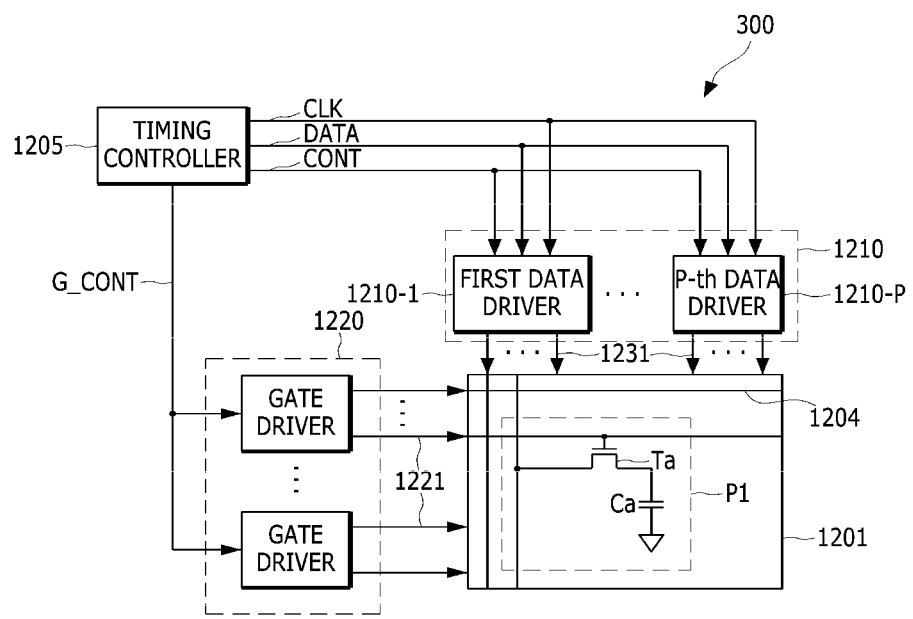
FIG. 14 is a block diagram showing the configuration of an exemplary display device according to one or more embodiments of the present invention.

For example, the data received from the timing controller 1205 in FIG. 14 may be red (R), green (G), and blue (B) data. The first latches of the first latch unit 130 may store R, G, and B data.

The second latch unit 140 stores data output from the first latch unit 130 in response to a control signal supplied from the timing controller 1205.

For example, the second latch unit 140 may store the data output from the first latch unit 130 on a horizontal line period basis. One horizontal line period may be a period taken to completely store data corresponding to one horizontal line 1204 in FIG. 14 of a display panel in the first latches of the first latch unit 130.

The second latch unit 140 may include a plurality of second latches. The number of the second latches may be equal to the number of the first latches.

The level shifter unit 150 shifts a voltage level of data supplied from the second latch unit 140. For example, the level shifter unit 150 may shift first data having a first-level voltage from the second latch unit 140 to second data having a second-level voltage.

For example, the drive voltage of the level shifter unit 150 may be higher than the drive voltage of the first and second latch units 130 and 140.

In addition, the level shifter unit 150 may include a plurality of level shifters. The number of the level shifters may be equal to the number of the first latches and/or the number of the second latches. Embodiments of the present invention are not limited to such conditions.

Each of the level shifters may be or comprise one of the level shifters according to the various embodiments of the present invention (e.g., the level shifters 100-1 to 100-7 and the level shifters 200-1 to 200-4).

The digital-to-analog converter 160 converts an output from the level shifter unit 150 (namely, digital data) into an analog signal.

In addition, the grayscale voltage generator 165 generates grayscale voltages.

For example, the digital-to-analog generator 165 may receive grayscale voltages from the grayscale voltage generator 165 and may convert an output from the level shifter unit 150 into an analog signal based on the grayscale voltages.

The grayscale voltage generator 165 may generate multi-level grayscale voltages (e.g., 256-level grayscale voltages).

The output buffer unit 170 amplifies (or buffers) the analog signal output from the digital-to-analog converter 160 and outputs the amplified (or buffered) analog signal.

In addition, the output buffer unit 170 may include a plurality of amplifiers and/or a plurality of buffers.

Figure 13:
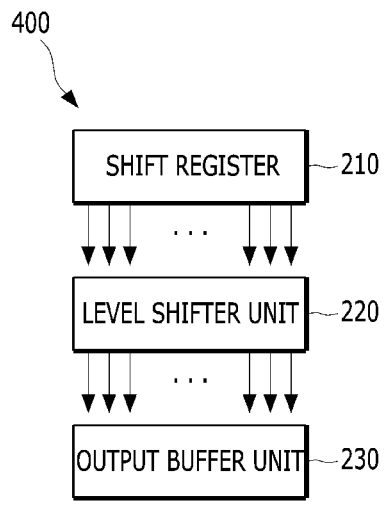
FIG. 13 is a block diagram showing the configuration of an exemplary gate driver according to one or more embodiments of the present invention.

FIG. 13 shows the configuration of an exemplary gate driver 400 according to one or more embodiments of the present invention.

Referring to FIG. 13, the gate driver 400 may include a shift register 210, a level shifter unit 220, and an output buffer unit 230.

The shifter register 210 generates logic signals configured to drive gate lines based on a gate control signal supplied from the timing controller 1205, and output the logic signals.

In addition, the level shifter unit 220 shifts or changes voltage levels of the logic signals output from the shift register 210 and outputs resultant signals.

Furthermore, the level shifter unit 220 may include a plurality of level shifters configured to shift voltage levels of logic signals. Each of the level shifters may be one of the level shifters according to the various embodiments of the present invention (e.g., the level shifters 100-1 to 100-7 and the level shifters 200-1 to 200-4).

The output buffer unit 230 outputs signals output from the level shifter unit 220 to the gate lines. For example, the output buffer unit 230 may include a plurality of output buffers configured to output signals from the level shifter unit 220 to the respective gate lines.

FIG. 14 shows the configuration of a display device 1000 according to one or more embodiments of the present invention.

Referring to FIG. 14, the display device 1000 includes a display panel 1201, a timing controller 1205, a source driver unit 1210, and a gate driver unit 1220.

The display panel 1201 may include gate lines 1221 in rows, and data lines 1231 in columns. The gate lines 1221 and the data lines 1231 intersect, thereby forming a matrix. The display panel 1201 may also include pixels connected to the gate lines 1221 and data lines 1231 at respective intersections of the gate and data lines 1221 and 1231.

The pixels connected to the gate lines 1221 and 1231 may be in a matrix having rows and columns.

Each pixel may include a transistor Ta connected to the associated gate and data lines, and a capacitor Ca connected to the transistor Ta.

For example, each pixel may include a red (R) sub-pixel, a green (G) sub-pixel, and a blue (B) sub-pixel. Each of the R, G and B sub-pixels may include a transistor Ta connected to the associated gate and data lines, and a capacitor Ca connected to the transistor Ta.

The timing controller 1205 outputs a clock signal CLK, data DATA, a first control signal CONT configured to control the source driver unit 1210, and a second control signal G_CONT configured to control the gate driver unit 1220.

For example, the first control signal CONT may include a horizontal start signal input to the shift register 120 of FIG. 12) of the source driver, an enable signal En, and the clock signal CLK. The second control signal G_CONT may include gate control signals configured to drive the respective gate lines 1221.

The gate driver unit 1220 drives the gate lines 1221. The gate driver unit 1220 may include a plurality of gate drivers. The gate driver unit 1220 may output, to the respective gate lines 1221, gate drive signals configured to control respective transistors Ta of the pixels.

Each gate driver of the gate driver unit 1220 may be the gate driver 400 of the embodiments in FIG. 13.

The source driver unit 1210 drives the data lines 1231 or channels of the display panel 1201. The source driver unit 1210 may include a plurality of source drivers 1210-1 to 1210-P (P being a natural number greater than 1 (P>1)).

Each of the source drivers 1210-1 to 1210-P (P being a natural number greater than 1 [P>1]) may be the source driver 300 of the embodiments in FIG. 12.

As apparent from the above description, according to the various embodiments of the present invention, it may be possible to reduce the generation or incidence of a peak current and the size of the level shifter, and improve the EMI characteristics of downstream devices.

The various embodiments as described may include particular features, structures, or characteristics, but not every embodiment necessarily includes the particular features, structures, or characteristics. Furthermore, the particular features, structures or characteristics in each embodiment may be combined in any suitable manner, as would be apparent to one of ordinary skill in the art from this disclosure, in one or more embodiments of the present invention. Therefore, combinations of features of different embodiments are meant to be within the scope of the invention.

What is claimed is:

1. A level shifter, comprising:
   an input unit comprising (i) a first input transistor having a first gate configured to receive a first input signal, a first source, and a first drain connected between a first connection node and a first node configured to receive a first voltage, and (ii) a second input transistor having a second gate configured to receive a second input signal, a second source, and a second drain connected between a second connection node and the first node;
   an output unit comprising (i) a first output transistor having a third gate connected to a first output terminal, a third source, and a third drain connected between a second node configured to receive a second voltage and a second output terminal, and (ii) a second output transistor having a fourth gate connected to the second output terminal, a fourth source, and a fourth drain connected between the second node and the first output terminal;
   a first bias unit connected between the first and second connection nodes and the first and second output terminals, configured to control a first voltage drop between the first and second output terminals and the first and second connection nodes based on or in response to a first bias signal;
   a second bias unit connected between the first and second output transistors and the first and second output terminals, configured to control a second voltage drop between the first output transistor and the second output terminal and a third voltage drop between the second output transistor and the first output terminal based on or in response to a second bias signal; and
   a first switch configured to supply the second voltage to the second output terminal based on or in response to a first control signal.

2. The level shifter according to claim 1, further comprising:
   a second switch configured to supply the second voltage to the first output terminal based on or in response to the first control signal.

3. The level shifter according to claim 1, further comprising:
   a second switch configured to supply the first voltage to the first output terminal based on or in response to a second control signal.

4. The level shifter according to claim 1, wherein the second voltage is higher than the first voltage.

5. The level shifter according to claim 1, wherein:
   each of the first and second input transistors comprises an N-channel transistor, and each of the first and second output transistors comprises a P-channel transistor; and
   each of the first and second bias transistors comprises a P-channel transistor.

6. The level shifter according to claim 1, wherein each of the first and second input transistors has a smaller channel width than each of the first and second output transistors.

7. A level shifter comprising:
an input unit comprising (i) a first input transistor having a first gate configured to receive a first input signal, a first source, and a first drain connected between a first connection node and a first node configured to receive a first voltage, and (ii) a second input transistor having a second gate configured to receive a second input signal, a second source, and a second drain connected between a second connection node and the first node;
an output unit comprising (i) a first output transistor having a third gate connected to a first output terminal, a third source, and a third drain connected between a second node configured to receive a second voltage and a second output terminal, and (ii) a second output transistor having a fourth gate connected to the second output terminal, a fourth source, and a fourth drain connected between the second node and the first output terminal;
a first bias unit comprising (i) a first bias transistor having a gate configured to receive a first bias signal, a source, and a drain connected between the first connection node and the second output terminal, and (ii) a second bias transistor having a gate configured to receive the first bias signal, a source, and a drain connected between the second connection node and the first output terminal;
a second bias unit comprising (i) a third bias transistor having a gate configured to receive a second bias signal, a source, and a drain connected between the first output transistor and the second output terminal, and (ii) a fourth bias transistor having a gate configured to receive the second bias signal, a source, and a drain connected between the second output transistor and the first output terminal;
a first switch configured to supply the first voltage to the first connection node based on or in response to a first control signal; and
a second switch configured to supply the first voltage to the second connection node based on or in response to the first control signal.

8. The level shifter according to claim 7, wherein the first and second output terminals are respectively set to the first voltage by turning on the first and second bias transistors based on or in response to the first bias signal, turning off the third and fourth bias transistors based on or in response to the second bias signal, and turning on the first and second switches based on or in response to the first control signal.

9. A level shifter, comprising:
an input unit comprising (i) a first input transistor having a first gate configured to receive a first input signal, a first source, and a first drain connected between a first connection node and a first node configured to receive a first voltage, and (ii) a second input transistor having a second gate configured to receive a second input signal, a second source, and a second drain connected between a second connection node and the first node;
an output unit comprising (i) a first output transistor having a third gate connected to a first output terminal, a third source, and a third drain connected between a second node configured to receive a second voltage and a second output terminal, and (ii) a second output transistor having a fourth gate connected to the second output terminal, a fourth source, and a fourth drain connected between the second node and the first output terminal;
a first bias unit comprising (i) a first bias transistor having a gate configured to receive a first bias signal, a source, and a drain connected between the first connection node and the second output terminal, and (ii) a second bias transistor having a gate configured to receive the first bias signal, a source, and a drain connected between the second connection node and the first output terminal;
a second bias unit comprising (i) a third bias transistor having a gate configured to receive a second bias signal, a source, and a drain connected between the first output transistor and the second output terminal, and (ii) a fourth bias transistor having a gate configured to receive the second bias signal, a source, and a drain connected between the second output transistor and the first output terminal; and
a first switch connected between the second output terminal and a third node, configured to receive a predetermined first supply voltage and supply the predetermined first supply voltage based on or in response to a first control signal.

10. The level shifter according to claim 9, wherein the second output terminal is set to the predetermined first supply voltage by turning off the first to fourth bias transistors based on or in response to the first and second bias signals, and turning on the first switch based on or in response to the first control signal.

11. The level shifter according to claim 9, further comprising:
a second switch connected between the first output terminal and a fourth node, configured to receive a predetermined second supply voltage and to supply the predetermined second supply voltage to the first output terminal based on or in response to a second control signal.

12. The level shifter according to claim 11, wherein the first output terminal is set to the predetermined second supply voltage is performed by turning off the first to fourth bias transistors based on or in response to the first and second bias signals, and turning on the second switch based on or in response to the second control signal.

13. The level shifter according to claim 11, wherein the predetermined second supply voltage is one of the first and second voltages.

14. The level shifter according to claim 9, wherein the predetermined first supply voltage is one of the first and second voltages.

15. A level shifter, comprising:
an input unit comprising (i) a first input transistor having a first gate configured to receive a first input signal, a first source, and a first drain connected between a first connection node and a first node configured to receive a first voltage, and (ii) a second input transistor having a second gate configured to receive a second input signal, a second source, and a second drain connected between a second connection node and the first node;
an output unit comprising (i) a first output transistor having a third gate connected to a first output terminal, a third source, and a third drain connected between a second node configured to receive a second voltage and a second output terminal, and (ii) a second output transistor having a fourth gate connected to the second output terminal, a fourth source, and a fourth drain connected between the second node and the first output terminal;

a first bias unit connected between the first and second connection nodes and the first and second output terminals, configured to control a first voltage drop between the first and second output terminals and the first and second connection nodes based on or in response to a first bias signal;

a second bias unit connected between the first and second output transistors and the first and second output terminals, configured to control a second voltage drop between the first output transistor and the second output terminal and a third voltage drop between the second output transistor and the first output terminal based on or in response to a second bias signal; and a first switch configured to supply the first voltage to the first output terminal based on or in response to a control signal.

16. The level shifter according to claim 15, further comprising:

a second switch configured to supply the first voltage to the second output terminal based on or in response to the control signal.

* * * * *